US007560138B2

(12) United States Patent
Perepezko et al.

(10) Patent No.: US 7,560,138 B2
(45) Date of Patent: Jul. 14, 2009

(54) OXIDATION RESISTANT COATINGS FOR ULTRA HIGH TEMPERATURE TRANSITION METALS AND TRANSITION METAL ALLOYS

(75) Inventors: John H. Perepezko, Madison, WI (US); Joon S. Park, Madison, WI (US); Ridwan N. Sakidja, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 598 days.

(21) Appl. No.: 11/299,427

(22) Filed: Dec. 12, 2005

(65) Prior Publication Data

US 2006/0228475 A1 Oct. 12, 2006

Related U.S. Application Data

(62) Division of application No. 10/428,336, filed on May 2, 2003, now Pat. No. 7,005,191.

(60) Provisional application No. 60/467,076, filed on May 1, 2003.

(51) Int. Cl.
*C23C 16/00* (2006.01)
*B05D 3/02* (2006.01)

(52) U.S. Cl. ............ 427/248.1; 427/372.2; 427/255.17; 427/255.18; 427/252; 148/279; 148/281

(58) Field of Classification Search .............. 427/248.1, 427/255.27, 372.2
See application file for complete search history.

(56) References Cited

U.S. PATENT DOCUMENTS 2,711,973 A 6/1955 Wainer et al.
3,090,702 A 5/1963 Commanday et al.
3,764,397 A 10/1973 Bornstein et al.
4,299,199 A 11/1981 Girone
5,281,565 A 1/1994 Hecht et al.
5,505,793 A 4/1996 Subramanian et al.
5,579,534 A 11/1996 Itoh et al.
5,595,616 A * 1/1997 Berczik ...................... 148/538
5,683,524 A 11/1997 Subramanian et al.
5,693,156 A 12/1997 Berczik
5,865,909 A 2/1999 Meyer et al.
5,975,852 A 11/1999 Nagaraj et al.
6,071,628 A 6/2000 Seals et al.

(Continued)

FOREIGN PATENT DOCUMENTS

WO WO 01/44533 6/2001

OTHER PUBLICATIONS

Park, J. S. et al., "Coating Designs for Oxidation Control of Mo-Si-B Alloys," Scripta Materialia 46, pp. 765-770 (2002), published by Elsevier Science Ltd.*

(Continued)

*Primary Examiner*—Michael Barr
*Assistant Examiner*—Ryan Schiro

(57) ABSTRACT

The invention provides oxidation resistant coatings for transition metal substrates and transition metal alloy substrates and method for producing the same. The coatings may be multilayered, multiphase coatings or gradient multiphase coatings. In some embodiments the transition metal alloys may be boron-containing molybdenum silicate-based binary and ternary alloys. The coatings are integrated into the substrates to provide durable coatings that stand up under extreme temperature conditions.

20 Claims, 10 Drawing Sheets

U.S. PATENT DOCUMENTS

| | | | | |
|---|---|---|---|---|
| 6,340,398 | B1 * | 1/2002 | Parthasarathy et al. | 148/279 |
| 6,365,281 | B1 | 4/2002 | Subramanian et al. | |
| 6,368,672 | B1 | 4/2002 | Thompson et al. | |
| 6,376,015 | B1 | 4/2002 | Rickerby | |
| 6,497,968 | B2 | 12/2002 | Zhao et al. | |
| 6,617,036 | B2 * | 9/2003 | Eaton et al. | 428/446 |
| 6,652,674 | B1 | 11/2003 | Woodard et al. | |

OTHER PUBLICATIONS

Perepezko, J. et al., "Development of High Temperature Coating Strategies for Mo-Si-B Alloy," Oral Presentation at University of Wisconsin-Madison, Dept. of Matls. Sci. and Eng., TMS 2002 131st Annual Meeting & Exhibit, Feb. 18, 2002.

Parthasarathy, T.A., et al., "Oxidation Mechanisms in Mo-reinforced Mo5SiB2(T2)—Mo3Si Alloys," Acta Materialia 50, pp. 1857-1868 (2002), published by Elsevier Science Ltd.

Maxwell, W. A., "Oxidation-resistance Mechanism and Other Properties of Molybdenum Disilicide," NACA Research Memorandum, Lewis Flight Propulsion Laboratory, Cleveland, Ohio, Mar. 14, 1952.

Schneibel, J. H., "Mo-Si-B Alloy Development," Oak Ridge National Laboratory, Metals and Ceramics Division, Oak Ridge, Tennessee.

Schneibel, J. H., et al., "Processing and Properties of Molybdenum Silicide Intermetallics Containing Boron," Oak Ridge National Laboratory, Oak Ridge, Tennessee.

Kramer, Matthew J., et al., "Oxidation Behavior of Mo-Si-B Alloys in Wet Air," Ames Laboratory, Iowa State University, Ames, Iowa.

Kramer, M. J., et al., "Novel Processing of Mo-Si-B Intermetallics for Improved Efficiency of Power Systems," Department of Materials Science and Engineering, Iowa State University, Ames, Iowa.

* cited by examiner (a)

(b)

Fig. 10
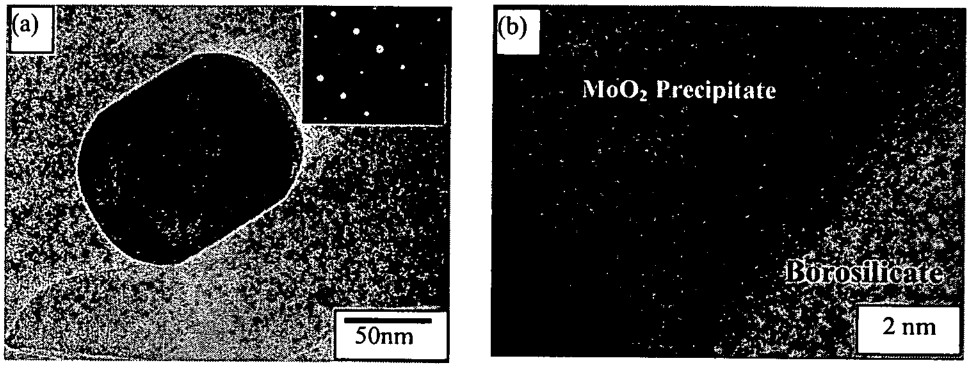
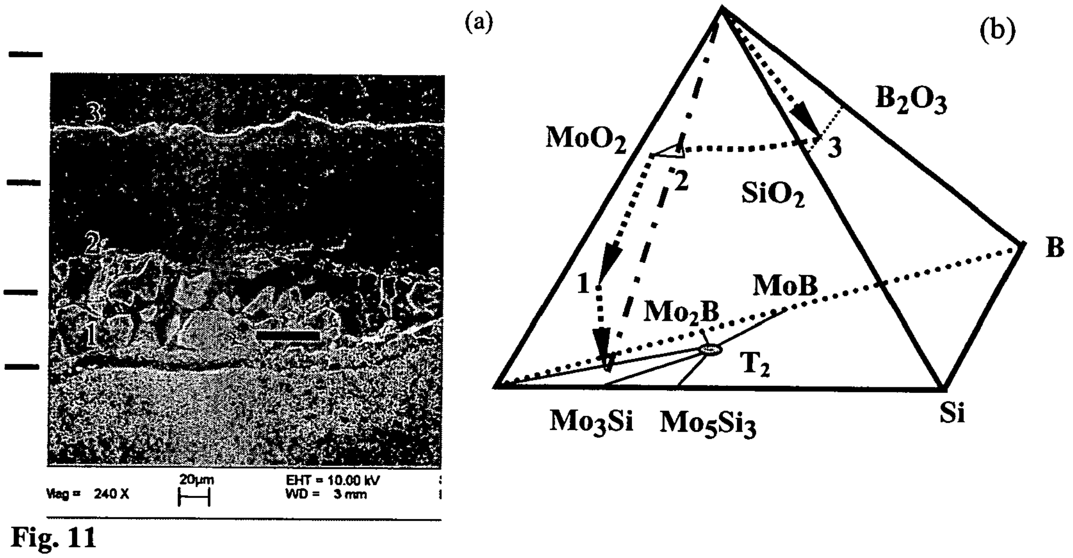
Fig. 11
Fig. 12
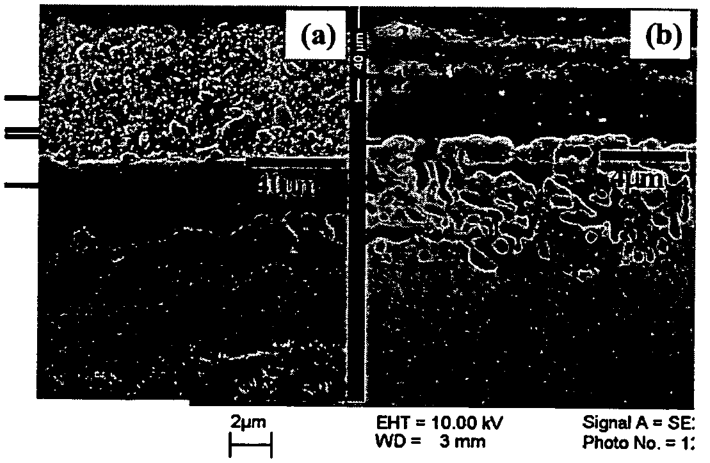

OXIDATION RESISTANT COATINGS FOR ULTRA HIGH TEMPERATURE TRANSITION METALS AND TRANSITION METAL ALLOYS

CROSS-REFERENCES TO RELATED APPLICATIONS

This application is a divisional of and claims priority to U.S. Ser. No. 10/428,336, filed May 2, 2003, pending, which claims priority to U.S. Provisional Application No. 60/467, 076, filed May 1, 2003, the entire disclosures of which are incorporated herein by reference in their entireties and for all purposes as if fully set forth herein.

STATEMENT OF GOVERNMENT INTERESTS

This invention was made with United States government support awarded by the Navy/ONR under grant number N00014-02-1-004 and Air Force/AFOSR under grant number F33615-98-C-7801.

FIELD OF THE INVENTION

The invention relates to oxidation resistant coatings for transition metal substrates and transition metal alloy substrates and method for making the same.

BACKGROUND OF THE INVENTION

For structural materials that are intended for high temperature application, it is essential that the material offer some level of inherent oxidation resistance in order to avoid catastrophic failure during use. Nickel based alloys, or superalloys, represent one class of material that is commonly used for high temperature applications, such as turbine components. These nickel based alloys have been found to exhibit good chemical and physical properties under high temperature, stress, and pressure conditions, such as those encountered during turbine operation. However, as larger planes with faster take-off speeds have developed a need has arisen for turbine materials that can withstand greater temperatures.

Multiphase intermetallic materials composed of molybdenum silicides are one alternative to the nickel based superalloys. These multiphase alloys may include either boron or chromium in addition to molybdenum and silicon and have the potential to withstand much higher operating temperatures than the nickel based superalloys. Although the chemical and physical properties of these molybdenum silicide alloys are promising, oxidation of these materials at high temperatures remains a significant problem in their development for use in high temperature applications. At high temperatures (above about 800° C.) these materials naturally form protective oxide coatings that hinder continued oxidation of the underlying material. However, this coating is insufficient to completely halt the oxidation process and over time the reaction of oxygen with molybdenum consumes the alloy.

SUMMARY OF THE INVENTION

The present invention provides oxidation resistant coatings for transition metal substrates and transition metal alloy substrates. The coatings may be multilayer, multiphase coatings or contiguous multiphase coatings having a compositional gradient extending from the substrate outward.

The coatings form a protective layer that prevents the substrate from oxidizing which results in a weakening of the substrate through dissolution or disintegration, particularly at high temperatures. The use of the coatings allows the substrates to be used in very high temperature applications where high strength is required. Because the coatings provided by the present invention are actually integrated into the underlying substrate they are resistant to cracking and peeling under the hot/cold cycles that are typically experienced by transition metals and transition metal alloys under actual operating conditions.

The coatings contain multiple phases, including phases of molybdenum, borosilicates, molybdenum borosilicides, and molybdenum silicides. Specific phases may include α-Mo (known as the BCC phase), $Mo_5SiB_2$ (known as the $T_2$ phase), $Mo_5Si_3$ with a small amount of boron (less than 5 atomic %) (denoted $Mo_5Si_3(B)$ and known as the $T_1$ phase), $Mo_3Si$ (known as the A15 phase), and $MoSi_2$ (known as the C11 phase).

A broad variety of substrates may benefit from the coatings of the present invention. The coating may be grown on any substrate having phase constituents of molybdenum (e.g. BCC), molybdenum silicides (e.g. $T_1$ or A15 or C11 or combinations thereof), and molybdenum borosilicides (e.g. $T_2$) at the surface of the substrate. In some instances, the substrate may itself be an alloy comprising molybdenum, silicon, and boron (denoted a Mo—Si—B alloy). In other cases the substrate will have a surface that has been enriched with molybdenum, silicon, and/or boron to produce a substrate surface having a Mo—Si—B alloy character. In either case, the surface of the substrate is desirably rich in molybdenum.

In addition to molybdenum silicides, borosilicates, and borosilicides, the coatings may include other compounds wherein the chemical composition of at least one of the phase constituents within the coating is all or partly replaced by other transition metals, other metalloids, simple metals or combinations thereof. For example, the coating may be a Mo—Ti—Cr—Si—B coating wherein a portion of the molybdenum in the coating has been chemically substituted with Ti and/or Cr in the BCC and $T_2$ phases. Alternatively, the coating may be a Mo—Si—B—Al coating wherein Al is substituted for a portion of the Si in the $Mo_3Si$ (A15) phase.

Two and three phase Mo—Si—B alloys are specific examples of molybdenum silicide alloys that benefit from the coatings of the present invention.

A first aspect of the present invention provides a multilayered, multiphase, oxidation resistant coating comprising molybdenum, silicon, and boron for substrates comprising various transition metals, metalloids, and simple metals. The multilayered coating includes a diffusion barrier layer which is integrated into at least one surface of the substrate, an oxidation resistant layer disposed above the diffusion barrier layer, and an oxidation barrier layer disposed above the oxidation resistant layer. The coatings may optionally also include a thermal barrier layer disposed on the oxidation barrier layer. The diffusion barrier layer comprises mainly borosilicides. Typically, the borosilicides will contain primarily $Mo_5SiB_2$ ($T_2$ phase), although other phases may be present. Typically, the oxidation barrier layer comprises primarily borosilicates of $SiO_2$ and $B_2O_3$, although other phases may be present. Typically, the oxidation resistant layer comprising mainly molybdenum silicides, primarily of $MoSi_2$ (C11 phase), $Mo_5Si_3(B)$ ($T_1$ phase) or combinations thereof. The multilayered structures are formed in situ on the substrates such that they are integrated into the substrates. The diffusion barrier layer and the oxidation barrier layer are grown by annealing an oxidation resistant layer which is itself integrated into the substrate. Therefore, depending on the annealing conditions, in some embodiments of the invention, the oxidation resistant layer is desirably converted completely into two layers; an oxidation resistant layer and a diffusion barrier layer, and is thus eliminated. In such embodiments, the diffusion barrier layer, the oxidation resistant layer and the oxidation barrier layer are disposed against each other and integrated across their interfacial regions.

Each layer in the multilayered coating plays a role in protecting and maintaining the strength of the underlying substrate. The diffusion barrier layer helps to prevent the diffusion of reactive atoms, such as silicon from the oxidation resistant layer, into the substrate where they react with and eventually dissolve the substrate and deplete the oxidation resistant layer. The oxidation resistant layer comprises a material that is capable of forming an oxidation resistant surface oxide layer upon exposure to oxygen. The oxide layer grown from the oxidation resistant layer provides the oxidation barrier layer in the multilayered coating. Thus, the oxidation resistant layer facilitates the formation of an oxidation barrier layer in situ. The oxidation barrier comprises a stable oxide capable of resisting oxidation at high temperatures. The optional thermal barrier layer thermally insulates the underlying coating layers and the substrate material.

The invention further provides a method for the in situ production of a multilayered, oxidation resistant coating on a Mo—Si—B alloy substrate or a substrate having a Mo—Si—B alloy surface character. The method includes the step of exposing the substrate to silicon vapor at a temperature and for a time sufficient to allow the silicon to diffuse into the surface of the substrate to form a molybdenum disilicide layer. The substrate and the molybdenum disilicide layer (the oxidation resistant layer) are then annealed in the presence of oxygen at a temperature and for a time sufficient to produce an oxidation barrier layer on the surface of the molybdenum disilicide layer. During the annealing process, the molybdenum dislicide layer undergoes several conversions. First the molybdenum disilicide layer is at least partially converted into other molybdenum silicide phases, such as $T_1$. For the purposes of this disclosure these new molybdenum silicide phases along with any remaining molybdenum disilicides are still considered to be part of the "oxidation resistant layer" of the coating. Second, a portion of the molybdenum disilicides are converted into borosilicides which make up a diffusion barrier layer. Finally, the portion of the molybdenum disilicides at the surface of the coating oxidize to form borosilicates which make up an oxidation barrier layer. By adjusting the annealing temperatures and times, the silicon to boron ratio in each of the layers can be carefully controlled. This process results in a multilayered structure where each layer is distinct from, but integrated with its neighboring layers. A thermal barrier layer may be applied to the outer surface of the oxidation barrier layer using convention means, such as thermal spray and spray deposition techniques.

A second aspect of the invention provides substrates coated with an oxidation resistant coating having a smooth compositional gradient which is integrated into the substrate. These coatings have a inner region comprising primarily borosilicides that serves as a diffusion barrier region, an intermediate region comprising primarily molybdenum silicides that serve as an oxidation resistant region and an outer layer comprising of borosilcates that serves as an oxidation barrier region. These regions are analogous to the diffusion barrier layer, the oxidation resistant layer and the oxidation barrier layer of the multilayered structures, however, because these coatings form a continuous compositional gradient, the diffusion barrier region and the oxidation resistant region blend smoothly into each other. Like the multilayered coatings, the gradient coating is integrated into the substrate. Also like the multilayered coatings, the gradient coatings may have a thermal barrier layer disposed on their outer surface.

Another aspect of the invention provides an oxidation resistant borosilicate coating having a reduced boron concentration for a Mo—Si—B alloy substrate or a substrate having a Mo—Si—B alloy surface character. The borosilicate coating is produced by applying a thin film of silicon dioxide to the substrate and annealing the thin film coated substrate at a temperature and for a time sufficient to convert the $SiO_2$ film into a borosilicate coating layer. The $SiO_2$ is desirably amorphous $SiO_2$, however crystalline $SiO_2$ may also be used. The boron concentration in the borosilicate layer so produced is lower than the boron concentration in a borosilicate layer that is formed by the high temperature oxidation of the substrate in the absence of the $SiO_2$ coating. As a result, oxygen transport through the borosilicate coatings of this invention is substantially reduced in comparison to the oxygen transport of naturally occurring borosilicate coatings formed through in situ high temperature oxidation of the substrate. In addition, in certain embodiments, the borosilicate layer having a reduced boron concentration may be produced without the formation of an intermediate $MoO_2$ layer between the borosilicate and the substrate which supports the formation of the coating as a barrier to oxygen transport through the surface layer.

Further objects, features and advantages of the invention will be apparent from the following detailed description when taken in conjunction with the accompanying drawings.

BRIEF DESCRIPTION OF THE DRAWINGS

In the drawings:

FIG. 10 shows (a) a TEM image and diffraction pattern for the $MoO_2$ precipitate formed in the in-situ borosilicate layer (outer layer), (b) HR-TEM image of the rectangle area in (a).

FIG. 11 shows (a) a cross section BSE image of the Mo-14.2Si-9.6B (at %) alloy oxidized at 1200° C. for 100 hr in air, (b) a schematic illustration of the diffusion pathway indicating the phase evolution upon oxidation of a Mo—Si—B alloy located in the Mo—$Mo_3Si$-$T_2$ three phase field (virtual diffusion path between borosilicate and $MoO_2$ is also indicated). (The numbers indicate (1) Mo(ss) phase with internal oxide precipitates, (2) $MoO_2$ and (3) borosilicate layer. The region below (1) in (a) is the alloy substrate.)

FIG. 12 is a cross-section BSE image of (a) crystal $SiO_2$ powder and (b) amorphous $SiO_2$ powder sprayed Mo-14.2Si-9.6B (at %) alloy following oxidation at 1200° C. for 100 hr. (The numbers in each figure indicate: (1) Mo(ss) phase with internal oxide precipitates, (2) $MoO_2$ and (3) borosilicate layer. The region below (1) is the alloy substrate.)

DETAILED DESCRIPTION OF THE INVENTION

Figure 1:
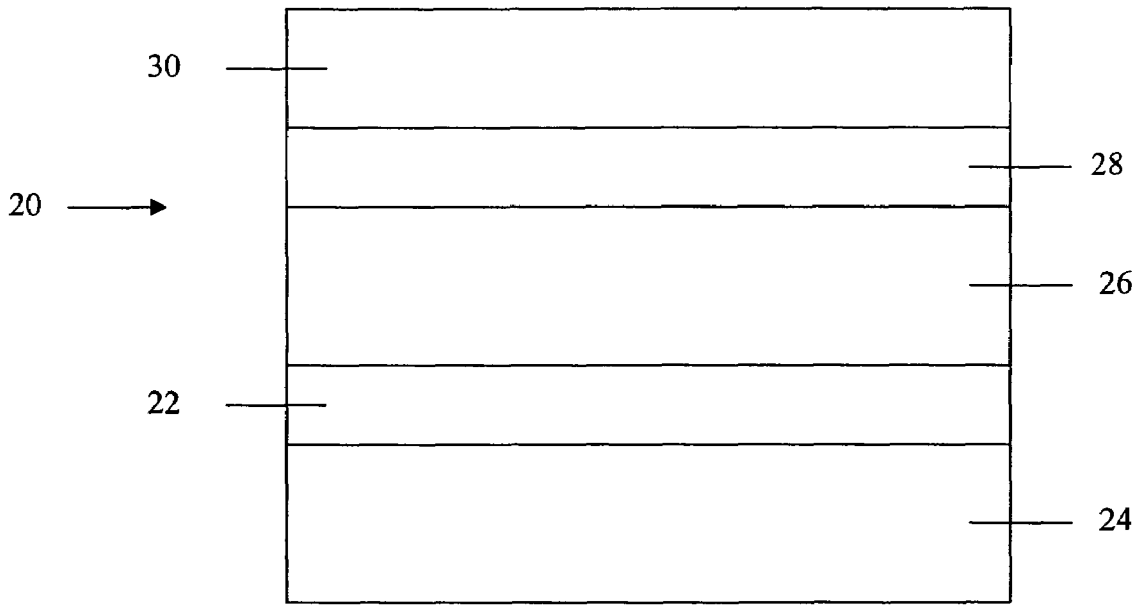
FIG. 1 shows a schematic illustration of a multilayered, oxidation resistant coating on a Mo—Si—B alloy substrate in accordance with the present invention.

The present invention provides coatings for various transition metal-containing substrates, and methods for producing the coatings. The coatings may be multilayered, multiphase coatings comprising oxidation resistant layers and diffusion barrier layers wherein the various layers are substantially distinct from each other. Alternatively, the coatings may be contiguous, multiphase coatings having a compositional gradient and including regions that act as oxidation resistant regions and regions that act as diffusion barriers. The coatings are integrated into the substrates.

A broad variety of substrates may benefit from the coatings of the present invention. The coatings may be grown on any substrate having phase types of molybdenum (BCC), molybdenum silicides (A15 or T1 or C11 or combinations thereof), and molybdenum borosilicides ($T_2$) at the surface of the substrate. In some instances, the substrate may itself be an alloy comprising molybdenum, silicon, and boron (denoted a Mo—Si—B alloy). In other cases the substrate will have a surface that has been enriched with molybdenum, silicon, and/or boron to produce a substrate surface having a Mo—Si—B alloy character. (For the purposes of this disclosure, a surface has a Mo—Si—B alloy character if the surface includes enough Mo, Si, and B to permit the in situ growth of molybdenum silicide phases in the surface region of the substrate upon exposure to Si atoms at elevated temperatures). In either case, the surface of the substrate is desirably rich in molybdenum. Substrates suitable for surface enrichment are those in which a solid solution chemical mixture may be formed between at least one of the coating elements (Mo, Si, B) and at least one of the elements in a substrate in at least one of the phases of the coating system (e.g. $\alpha$-Mo (BCC), $T_2$, $Mo_3Si$, $T_1$ or $MoSi_2$). This criterion is met for many substrates composed of transition metals, metalloids, simple metals, or combinations thereof. The substrate may be an alloy or a substantially pure metal. The ability of transition metals, metalloids, and simple metals to form solid solutions with these coating elements is discussed in "Handbook of Ternary Alloy Phase Diagrams", ed. P. Villars, A. Prince, and H. Okamoto, 5, (Materials Park, Ohio: ASM International, 1995), which is incorporated herein by reference.

Suitable transition metals for use as or in the substrates include V, Nb, Ta, Ti, Zr, Hf, Fe, Mn, Co, and the like. Suitable metalloid or simple metals include Al, Ga, In, C, Ge, Sn, P and the like. Refractory metals and refractory metal alloys are a group of transition metals that are desirably used as substrate materials.

The enrichment of the substrate surface may be accomplished by exposing the substrate to Mo, Si, and/or B under conditions that promote the mixing of the Mo, Si, and/or B with the underlying substrate. Enrichment of the chemical composition of the surface regions of the substrate can take place using individual elements of Mo, Si or B or combined elements of Mo—Si, Mo—B, Si—B or Mo—Si—B. Methods for enriching a substrate with Mo, Si, and B are well known and include, but are not limited to, pack cementation and chemical vapor deposition. The deposited elements may be mixed with the substrate using conventional solid state annealing techniques. Typically, the solid state annealing will take place at temperature of at least 800° C. for at least 24 hours. Higher temperatures and longer times favor faster reaction kinetics. The choice of enrichment elements or compositions will depend on the nature of the underlying substrate. For example, a substrate of a titanium-silicon-aluminum alloy would require enrichment with molybdenum and boron. A substantially pure titanium substrate, on the other hand, would require enrichment with molybdenum, silicon, and boron.

Methods for introducing molybdenum, silicon, and boron into substrate surfaces are described in Stolarski, T. A.; Tobe, S., Wear, December 2001; 249(12): 1096-102; Shiraishi, M.; Ishiyama, W.; Oshino, T.; Murakami, K., Japanese Journal of Applied Physics, Part 1, Regular Papers, Short Notes & Review Papers, December 2000; 39(12B): 6810-1; Iordanova, -I.; Forcey, K. S.; Gergov, B.; Bojinov, V., Surface and Coatings Technology, May 1995; 72(1-2): 23-9; Tjong, S. C.; Ku, J. S.; Wu, C. S., Scripta Metallurgica et Materialia, 1 Oct. 1994; 31(7): 835-9; Stachowiak, G. W.; Stachowiak, G. B.; Batchelor, A. W., Wear, November 1994; 178(1-2): 69-77; Chemical Vapor Deposition of Mo; Isobe, Y.; Yazawa, Y.; Son, P.; Miyake, M., Journal of the Less Common Metals, 1 Jul. 1989; 152(2): 239-50; Stolz, M.; Hieber, K.; Wieczorek, C., Thin-Solid-Films, 18 Feb. 1983; 100(3): 209-18; Stolz, M.; Hieber, K.; Wieczorek, C., Thin-Solid Films, 18 Feb. 1983; 100(3): 209-18; Slama, G.; Vignes, A., Journal of the Less Common Metals, 1971; 23(4): 375-93; Cockeram, B. V., Surface and Coatings Technology, November 1995; 76(1-3): 20-7; Ning-He; Ge-Wang; Rapp, R. A., High Temperature and Materials-Science, August-December 1995; 34(1-3): 117-25, the disclosures of which are incorporated herein by reference.

Mo—Si—B alloys provide non-limited examples of substrates that benefit from the coatings of the present invention. Such alloys are well-known in the art. These alloys include both two and three phase alloys, however due their superior oxidation resistance, three phase alloys will likely be the focus for many applications of the coatings provided by this invention. For example, the Mo—Si—B alloy may include $\alpha$-Mo, $Mo_3Si$, and $Mo_5SiB_2$ phases. Alternatively, the alloy may include $Mo_5Si_3$, $Mo_5SiB_2$, and $Mo_3Si$ phases. Yet another suitable alloy substrate is made from $Mo_5Si_3$, $MoSi_2$, and MoB phases. More detailed descriptions of molybdenum silicide based substrates for use in the coating systems of the present invention may be found in U.S. Pat. Nos. 5,595,616; 5,693,156; and 5,865,909. The entire disclosure of each of these patent is incorporated herein by reference. Because the Mo—Si—B alloys already have a Mo—Si—B alloy surface character, no surface enrichment is required prior to the growth of the oxidation resistant coating.

One aspect of the present invention provides a multilayered, oxidation resistant coating for a transition metal or transition metal alloy substrate which prevents the substrate from oxidizing at high temperatures, thereby allowing the substrate to be used in high temperature applications. As shown in FIG. 1, the coating 20 is constructed from a diffusion barrier layer 22 disposed on and integrated into the alloy substrate 24, an oxidation resistant layer 26 above the diffusion barrier layer 22, an oxidation barrier layer 28 on the oxidation resistant layer 26, and optionally a thermal barrier layer 30. The substrate, the diffusion barrier layer, the oxidation resistant layer and the oxidation barrier layer, form a multilayered structure where each layer is integrated with its neighboring layers. This construction is advantageous because it prevents cracking, peeling, and delaminating under extreme operating temperatures and pressures.

The oxidation barrier layer 28, the oxidation resistant layer 26, and the diffusion barrier layer 22 are grown from the substrate 22 in situ. This is advantageous because in situ growth eliminates abrupt interfaces between the layers in the coating which tend to separate at elevated temperatures, weakening the structure.

A oxidation resistant layer 26 comprising molybdenum disilicide ($MoSi_2$) may be grown on a substrate surface having a Mo—Si—B character 24 by exposing the substrate to Si vapor under conditions which allow the Si to diffuse into at least one surface of the substrate where it reacts with Mo to form $MoSi_2$. This may be accomplished by conventional means, such as by pack cementation or chemical vapor deposition. In pack cementation the $MoSi_2$ layer is formed by depositing silicon onto the surface of the substrate and heating the components in a furnace. During the heat treatment, the silicon atoms migrate into the substrate. To facilitate the reaction between the Mo and the Si, the substrate will typically be heated to a temperature of at least about 800° C. and the reaction should be allowed to proceed for at least about 24 hours. This includes deposition methods where the substrate is heated to about 900° C. for at least 48 hours. For thicker coatings, annealing can be done at either higher temperatures, longer times, or both.

An oxidation barrier layer 28 is produced in a second annealing step wherein the $MoSi_2$ is annealed in the presence of oxygen at high temperatures to form borosilicates at the surface of the $MoSi_2$ layer. At the same time, at least a portion of the $MoSi_2$ layer is converted into other molybdenum silicates, such as $T_1$ phases, which are incorporated into the oxidation resistant layer along with the remaining $MoSi_2$. Simultaneously, at the elevated annealing temperature a portion of the $MoSi_2$ above the alloy substrate is converted to the $T_2$ phase. This $T_2$ phase layer between the alloy substrate 24 and the oxidation resistant layer serves as the diffusion barrier layer 22.

The oxidation barrier layer forms as follows: during the annealing process a portion of the $MoSi_2$ produces $MoO_3$, a volatile compound that evaporates from the structure leaving a surface rich in silicon and boron (which diffuses up from the underlying substrate) which react to form a protective borosilicate scale. The resulting borosilicate scale is predominantly made from $SiO_2$ with a smaller concentration of $B_2O_3$. The presence of $B_2O_3$ in the scale is advantageous because it decreases the viscosity of the borosilicate layer, providing enough flow to heal small cracks or defects that appear in the layer. This is desirable because it allows the structure to self-heal from damage caused by the impact of foreign objects. However, too much boron in the borosilicate layer will reduce the oxidation resistance of the barrier. Therefore, the coatings should have a boron:silicon ratio that is low enough to provide a barrier to oxidation. In some embodiments the boron concentration in the oxidation barrier layer 28 is no more than about 25 atomic percent. This includes embodiments wherein the boron concentration in the oxidation barrier layer 28 is no more than about 10 atomic percent, further includes embodiments wherein the boron concentration in the oxidation barrier layer 28 is no more than about 6 atomic percent, and still further includes embodiments wherein the boron concentration in the oxidation barrier layer 28 is no more than about 3 atomic percent.

The diffusion barrier layer 22 is produced during the annealing process serves to prevent or hinder the diffusion of silicon atoms from the oxidation barrier layer 28 and the oxidation resistant layer 26, which have relatively high Si concentrations, to the underlying substrate 24 which has a lower Si concentration. This is desirable because the continued exposure of the alloy substrate to Si atoms would eventually lead to the dissolution of the substrate and depletion of the oxidation resistant layer 26. The $T_2$ phase layer provides a low mobility of silicon transport that prevents or hinders the diffusion of silicon from the upper coating layers to the underlying alloy substrate 24. The thickness of the diffusion barrier layer 22 may have a range of values.

The annealing temperature for the formation of the oxidation barrier layer 28 and diffusion barrier layer 22 may be higher than the temperature at which the oxidation resistant layer 26 is initially formed. In various embodiments the annealing temperature may be at least 800° C. or even at least 1000° C. The annealing time may be at least 24 hours.

In some embodiments, the total thickness of the diffusion barrier layer, the oxidation barrier layer and any oxidation resistant layer will be at least 20 microns, but in other embodiments the total thickness may be greater.

The multilayered, oxidation resistant coatings of the present invention may optionally include an overlying thermal barrier layer 30 which thermally insulates the underlying coating layers and the alloy substrate 24 by producing a temperature drop across the thermal barrier layer. As a result, the operating temperature capabilities of the material so insulated are extended. The thermal barrier layer 30 typically comprises a heat resistant ceramic and is generally characterized by a low thermal conductivity and, preferably, low oxygen diffusivity. In addition, the material comprising the thermal barrier layer 30 and the oxide comprising the underlying oxidation barrier layer 28 should have similar coefficients of thermal expansion. This reduces the thermal stress at the interface at elevated temperatures and prevents cracking of the thermal barrier layer 30 or separation of the thermal barrier layer 30 from the oxidation barrier layer 28. Ceramics suitable for use as thermal barriers include, but are not limited to, zirconia, stabilized zirconia, $Al_2O_3$, mullite, $Ca_{0.5}Sr_{0.5}Zr_4P_6O_{24}$, and combinations thereof. In addition, the inventors have discovered that $TiO_2$ is particularly well suited for use with multilayered coatings grown on molybdenum silicide based alloys because $TiO_2$ has a coefficient of thermal expansion close to that of the $SiO_2$ in the borosilicate oxidation barrier layer and is able to exist in equilibrium with the $SiO_2$.

The thermal barrier layer 30 may be deposited by conventional techniques, including thermal spray techniques, such as plasma spray, and vapor deposition techniques, such as electron beam physical vapor deposition. The desired thickness of the thermal barrier layer 30 will depend on the intended application for the metal alloy substrate.

A second aspect of the invention provides substrates coated with an oxidation resistant coating having a smooth compositional gradient which is integrated into the substrate. The first step in producing these gradient coatings is to alloy a Mo—Si—B alloy substrate or a substrate having a Mo—Si—B alloy surface character with a phase modifier element. If the substrate is a Mo—Si—B alloy, suitable substrates may be formed by alloying a the phase modifier element with the molybdenum, silicon, and boron during the production of the substrate. Alternatively, the phase modifier may be alloyed with the substrate during the process of enriching the surface of the substrate with molybdenum, silicon, and/or boron. For example, when the substrate does not initially contain molybdenum, silicon, and/or boron, the surface of the substrate can be enriched with one or more of these elements using solid state annealing techniques, such as pack cementation, to produce a substrate having a Mo—Si—B alloy surface character, as described above. The phase modifier element may be added along with the surface enriching elements during this process to produce the alloyed substrate. The resulting alloyed substrate is then contacted with silicon under conditions sufficient to induce the diffusion of silicon into the substrate and the reaction of the silicon with molybdenum in the substrate. Silicon pack cementation is one process that may be used for this purpose. Because the silicon has a different mobility in the various phases of the substrate it reacts with the different phases at different rates to produce a compositional gradient extending from the substrate outward.

The gradient coating comprises primarily borosilicides, such as $T_2$, alloyed with the phase modifier in the region near the underlying substrate and primarily $MoSi_2$ alloyed with the phase modifier in the region near the exterior surface. When exposed to oxygen at elevated temperatures, the alloyed $MoSi_2$ phase oxidizes to form an oxidation barrier layer of borosilicates. The concentration of oxidation resistant phases (or a character of an oxidation resistant layer) in the outer region of the gradient coating is higher than the concentration of the oxidation resistant phases in the inner region of the gradient. Similarly, the concentration of silicon diffusion resistant phases (or a character of a silicon diffusion resistant layer) in the inner region is higher than the concentration of silicon diffusion resistant phased in the outer region. Therefore, the gradient coatings provide resistance toward both oxidation and silicon diffusion.

The phase modifier element may be any transition metal, metalloid, or simple metal that accentuates the difference in mobility of silicon between two or more of the various molybdenum, molybdenum borosilicate, molybdenum borosilicide, and molybdenum silicide phases of the substrate. Tungsten is one non-limiting example of a transition metal phase modifier. Other suitable phase modifiers include, but are not limited to hafnium, niobium, and titanium.

Another aspect of the invention provides a protective borosilicate coating having a reduced boron concentration for a transition metal substrate or a transition metal alloy substrate having an Mo—Si—B alloy surface character. One example of a suitable transition metal alloy substrate is a Mo—Si—B alloy substrate. These protective coatings use a thin $SiO_2$ film to improve upon the oxidation resistant coatings that naturally form on the surface of substrates having a Mo—Si—B alloy surface character upon oxidation at high temperatures by reducing the boron concentration in the resulting borosilicates.

Mo—Si—B alloys will naturally form an oxidation resistant borosilicate layer when allowed to oxidize at high temperatures. This process has been described for the three phase Mo, $Mo_5SiB_2$, $Mo_3Si$ system by Park et al. in Scripta Materialia, 46, 765-770 (2002), which is incorporated herein by reference. Briefly, oxidation of the Mo—Si—B alloys initially leads to $MoO_3$ formation, but the $MoO_3$ layer offers no protection to continued oxidation. In fact, $MoO_3$ is a highly volatile species that vaporizes from the surface at temperatures above about 750° C., leaving a surface enriched in Si and B that develops a protective $SiO_2$ layer containing some $B_2O_3$ (i.e., the borosilicate layer) at high temperatures (e.g., temperatures of about 1000-1200° C.). The borosilicate surface layer does restrict oxygen transport and provides a reduced oxygen activity so that a stable $MoO_2$ phase forms at the substrate alloy surface. This borosilicate scale so produced is protective, but it does not completely block oxygen transport so that with continued oxidation exposure, the thickness of the exterior scale increases along with a recession in the alloy substrate.

The present invention provides an improved borosilicate coating which was made possible, at least in part, by the inventors' discovery that by enriching the $SiO_2$ content of the outer borosilicate layer the oxygen activity and the oxygen transport through the coating can be reduced. This may be accomplished by shifting the equilibrium of the coating from a borosilicate+$MoO_2$ system, as described above, towards a $SiO_2$+Mo system.

A borosilicate coating that is enriched in $SiO_2$ (i.e., having a reduced boron concentration) may be produced in accordance with the present invention by applying a thin film of $SiO_2$ to at least one surface of a Mo—Si—B alloy substrate and annealing the $SiO_2$ coated substrate at a temperature and for a time sufficient to form a borosilicate scale on the substrate. In some embodiments the formation of the borosilicate scale is accompanied by the formation of a Mo phase having internal oxide precipitates between the substrate and the borosilicate. The resulting scale will have a boron concentration that is lower that the boron concentration of a borosilicate scale formed through the high temperature oxidation of the substrate in the absence of the $SiO_2$ thin film. In some embodiments the boron concentration in the borosilicate coating is less than 6 atomic percent. This includes embodiments where the borosilicate coating contains less than about 5 atomic percent, further includes embodiments where the borosilicate coating contains less than 4 atomic percent, and still further includes embodiments where the borosilicate coating contains less that about 3 atomic percent. In some embodiments, the borosilicate coating is formed without the formation of a $MoO_2$ layer between the substrate and the borosilicate coating.

The $SiO_2$ may be applied to the surface of the alloy substrate by conventional deposition techniques. These techniques include, but are not limited to powder spraying, thermal spray deposition, and chemical vapor deposition. The applied $SiO_2$ film may be quite thin. Once the film is applied, or during the application of the film, the substrate and the $SiO_2$ are annealed at a temperature and for a time sufficient to produce the borosilicate coating. The annealing temperature and time will vary depending on a variety of factors, including the $SiO_2$ film thickness, the method of $SiO_2$ deposition and substrate used. Exemplary annealing temperatures and times include, but are not limited to, annealing temperature of at least 800° C. for annealing times of at least 24 hours.

The Mo—Si—B alloy substrates that may benefit from the borosilicate coatings having reduced boron concentrations include the two and three phase Mo—Si—B alloys listed above with respect to the multilayered, oxidation resistant coatings.

EXAMPLES

Example 1

Formation of a Multilayered, Oxidation Resistant Coating on a Three Phase Mo—Si—B Alloy Substrate Si pack cementation process was employed to produce a $MoSi_2$ oxidation resistant layer. A powder mixture of 70 wt % $Al_2O_3$, 25 wt % Si, and 5 wt % NaF were loaded in an alumina crucible together with clean alloy pieces (Mo-14.2Si-9.6B) followed by sealing with an $Al_2O_3$ slurry bond. The sample crucible was annealed at 900° C. for 48 hours in an Ar atmosphere. The detailed procedure is described in S. R. Levine and R. A. Caves, *J. Electrochem. Soc.: Solid-State Science and Technology*, 121, 1051 (1974) and A. Mueller, G. Wang, R. A. Rapp, E. L. Courtright and T. A. Kircher, *Mat. Sci. Eng.*, A155, 199 (1992). Briefly, the process involves the deposition of Si vapor carried by volatile halide species on the substrate embedded in a mixed powder pack at the elevated temperature, which consists of a halide salt activator and an inert filler.

Figure 2:
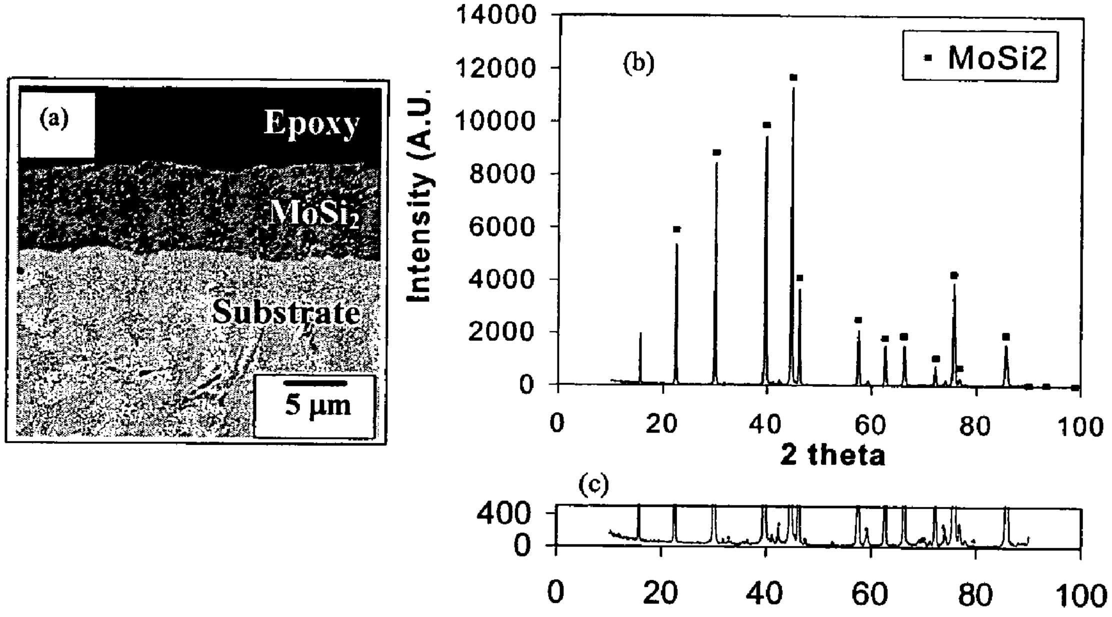
FIG. 2(*a*) shows a BSE image of an as-Si packed Mo-14.2Si-9.6B (at %) alloy, (b) shows the XRD scanning results of the as-Si packed sample showing $MoSi_2$ phase, and (c) shows the XRD of the same sample at low intensity indicating the MoB phase.

A BSE image of an as-Si packed sample is shown in FIG. 2(*a*). The nominal thickness of the $MoSi_2$ layer was observed as about 10 μm. During the Si pack cementation process, the inward Si diffusion to the substrate results in the formation of mainly the $MoSi_2$ phase. The reactively formed $MoSi_2$ layer was also confirmed by XRD (FIG. 2(*b*)). The reactive $MoSi_2$ layer formation in a diffusion couple between pure Mo and Si has been reported previously (see, for example P. C. Totorici and M. A. Dayananda, *Scripta Materialia*, 38, 1863 (1998); and P. C. Totorici and M. A. Dayananda, *Metall. Mater. Trans. A*, 38, 545 (1999)), where the intermediate silicides follow parabolic growth upon diffusion annealing and the growth of the $Mo_3Si$ phase is sluggish. Also, silicon, instead of molybdenum, mainly contributes to the formation of $MoSi_2$ and other silicides, which is consistent with the pack cementation observation (i.e. inward diffusion of Si).

Figure 3:
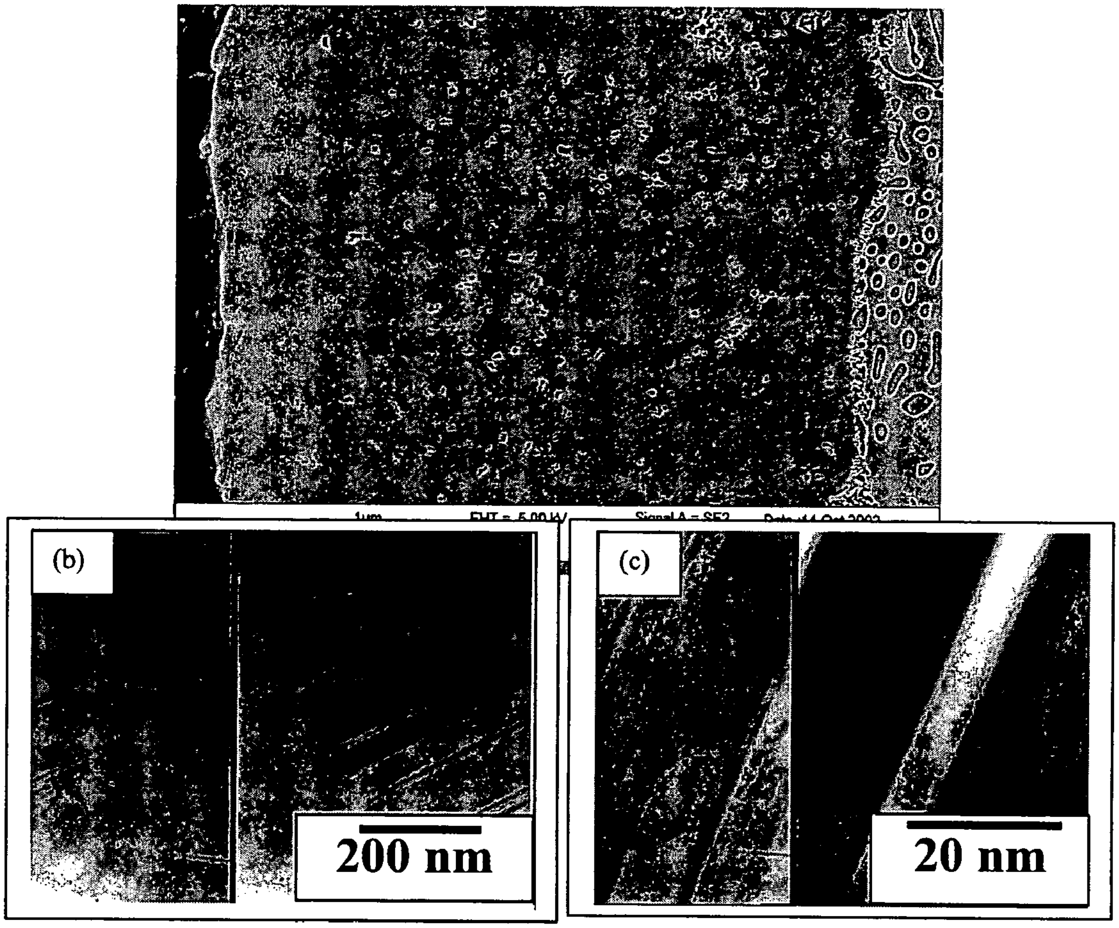
FIG. 3(*a*) shows an SE image of the as-pack cemented samples showing (1) the sub-micron dispersoids and (2) the eutectoid-like growth front, (b) shows a TEM image of the boride particle in the $MoSi_2$ phase matrix, (c) shows a higher-resolution TEM image of the particle showing the high density of staking faults associated likely with the $\alpha \Rightarrow \beta$ phase transition.

Silicon is the main diffusing element into the substrate during the pack cementation process, resulting in the formation of the $MoSi_2$ outer layer. However, the $MoSi_2$ phase is in equilibrium with the MoB and $T_1$ phases in the ternary Mo—Si—B system (see FIG. 2), which is different than the phase combination of the as-cast alloy composed of Mo, $Mo_3Si$ and $T_2$. This suggests that other phases exist between the $MoSi_2$ coating and the substrate when a local equilibrium holds during the interface reactions. Furthermore, the relatively slow mobility of Mo and B at this temperature particularly in the $T_2$ phase appears to suggest that a boride phase must accompany the formation of the $MoSi_2$ layer structure. A further examination of the cross section of the as-packed sample in a high-resolution Field Ion SEM following etching with a Murakami solution reveals the presence of sub-micron size particles (marked as 1 in FIG. 3(*a*)) that are highly etched and dispersed quite uniformly within the $MoSi_2$ layer. Furthermore, there is a reaction front beneath the outer $MoSi_2$ layer that appears to exhibit eutectoid-like structures. EDS (Energy-Dispersive Spectroscopy) examination on the dispersoid showed an absence of silicon. However, since boron can not be detected in EDS and the particle is too small, a structural examination via TEM was used in order to verify the types of borides formed. The TEM examination was conducted on samples that were annealed at 1200° C. for 24 hours following the coating treatment. The TEM evaluation clearly reveals the presence of MoB particles within the $MoSi_2$ (FIG. 3(*b*)). The large presence of twin boundaries is clearly evident in the high resolution TEM image (FIG. 3(*c*)). The large density of twins may be developed from the polymorphic phase transition between alpha and beta MoB. Thus, it appears that the reactive Si diffusion into the substrate may stabilize the beta-MoB phase initially, which then transformed into the alpha MoB phase through a polymorphic phase transition. The growth front beneath the $MoSi_2$+MoB particle layer appears to involve at least the MoB phase (marked 2 in FIG. 3(*a*)). In addition, the $Mo_5Si_3(B)$ or $T_1$ phase is more likely to be the second phase present in the growth front since the $T_1$ phase is the only phase that is in equilibrium with the $MoSi_2$, MoB and two phases from the substrate ($Mo_3Si$ and $T_2$ phase). The silicon reactive diffusion can immediately blanket the Mo(ss) phase and transform it into the $Mo_3Si$ phase resulting the growth front to proceed quite uniformly into the substrate.

Upon oxidation of $MoSi_2$ coatings on transition metals at high temperature, the $MoSi_2$ coating layer is transformed into $Mo_5Si_3$ (on the substrate side) and $SiO_2$ (on the free surface of $MoSi_2$ coating layer) as well, indicating that silicon depletion is a significant factor for determining the molybdenum disilicide coating lifetime. Also, it should be noted that the growth of the $SiO_2$ layer is about 2-3 orders of magnitude slower than that of the $Mo_5Si_3$ interlayer, suggesting that silicon depletion mainly contributes to impeding the growth of the $Mo_5Si_3$ phase. In order to retard the growth of the $Mo_5Si_3$ ($T_1$) phase consuming the molybdenum disilicide coatings, the effect of other elements such as Ta or Ge has been documented. For example, the rate constant of $Mo_5Si_3$ phase is about 2 times faster than $(Mo,Ta)_5Si_3$ phase at 1400° C. and the rate constant differences expand with increasing annealing temperature.

While the retardation of $Mo_5Si_3$ ($T_1$) growth can be achieved by selected alloying additions, the main limitation still resides in the fact that the $T_1$ phase exhibits a poor oxidation resistance. Recently, it has been reported that B addition to $T_1$ phase increases the oxidation resistance significantly. The Boron-doped $Mo_5Si_3$ ($T_1$) thin layer exhibits a superb high temperature oxidation resistance (see R. W. Bartlett and P. R. Gage, *Trans. of Metall. Soc. of AIME*, 230, 1528 (1964)). The implication of these results appears to be that the $MoSi_2$ layer coating is suitable for the Mo—Si—B alloys. Although the growth of the $T_1$ phase may still be high upon high temperature exposure, it can be as an excellent protective coating provided that the $T_1$ phase is saturated with B during the high temperature oxidation exposure.

Figure 4:
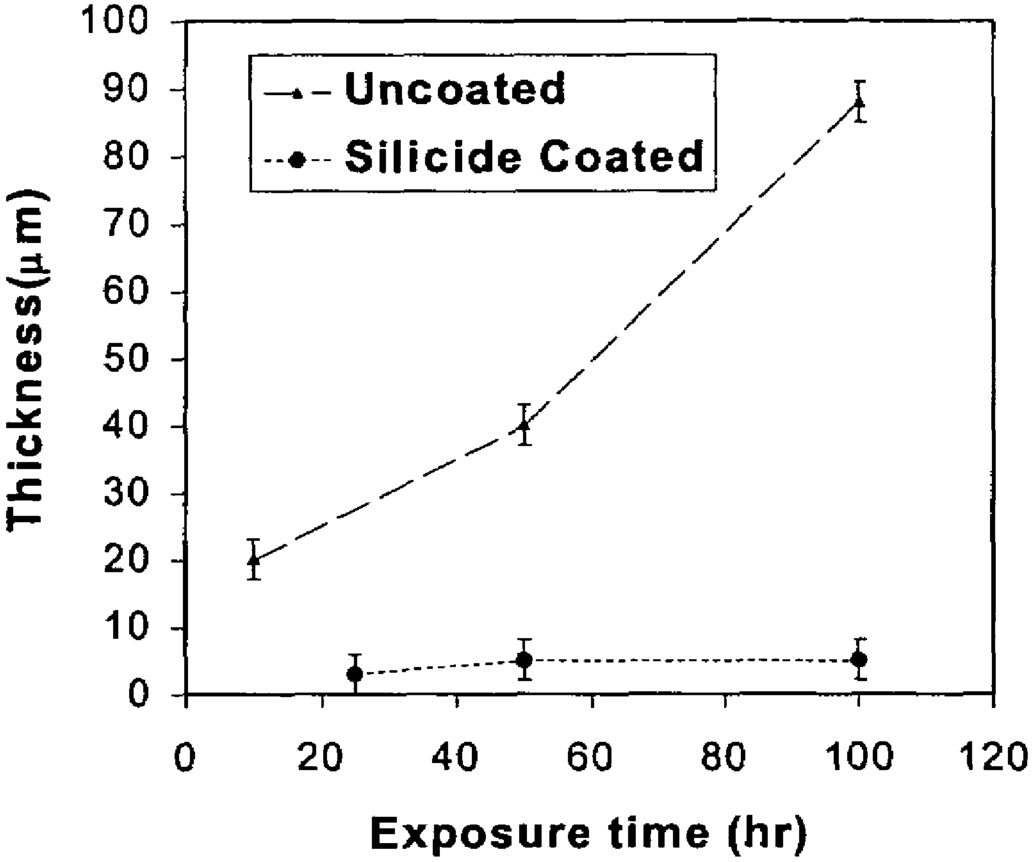
FIG. 4 shows the oxide thickness variation upon annealing time at 1200° C. with and without coating.

Upon oxidation test of the silicide coated samples, a thin oxide layer formed at the outer layer. On this layer several elements of Al, Na, Si and O were identified by EDS, in which Na is a byproduct from NaF during pack cementation. While $Al_2O_3$ may also be present (from residual pack cementation powder), the oxide scale formed was mainly composed of $SiO_2$. The observed typical thickness of the scale after the oxidation test at 1200° C. for 100 hours was less than 5 μm. Upon oxidation at 1200° C., the synthesized $MoSi_2$ phase had completely transformed into $Mo_5Si_3$ ($T_1$), when the exposure time reached 50 hr. While the $Mo_3Si$ phase did start to form within the $T_1$ phase on this sample upon further annealing, the depletion of Si on the surface which results in the $Mo_3Si$ phase formation was quite slow, since the oxide layer is very thin. This implies that the $T_1$ phase coating indeed serves as an effective protective layer due to the boron content. With further oxidation exposure up to 100 hours at 1200° C., the $T_1$ phase coating appears to remain stable and retain an excellent oxidation resistance. From this perspective, the use of a $MoSi_2$ and $Mo_5Si_3$ ($T_1$) phase coating appears to be effective in inhibiting the oxygen penetration to the substrate and furthermore remains intact with the substrate. In contrast, the substrate without a silicide phase coating that was subjected to a similar 1200° C. test for 100 hrs of oxidation, produces a thick borosilicate scale on the surface, with $MoO_2$ and an internal oxidation zone beneath it. The outer borosilicate layers of the silicide coated and the non-coated sample (without internal oxidation zone) are directly compared in FIG. 4. It is clear that while the thickness of the borosilicate layer of the non-coated sample increases upon oxidation time, the change in layer thickness on the coated sample is negligible during this time frame. For example, oxidation at 1200° C. for 100 hr yields a borosilicate layer thickness of about 85 μm for the non-coated sample, while the thickness is about 5 μm for the coated sample, which clearly shows an excellent oxidation resistance compared to the non-coated sample.

The transformation of $MoSi_2$ into the $Mo_5Si_3$ phase has been reported previously for the diffusion annealing of Mo with a $MoSi_2$ coating (see T. A. Kir and E. L. Courtright E L, *Mat. Sci. Eng.,* A155, 67 (1992)). The annealing treatment was not conducted in air in this case, since without B addition to the $Mo_5Si_3$ phase the coating has a poor oxidation resistance. The extrapolated value of the $Mo_5Si_3$ parabolic growth parameter, k ($x=k\sqrt{t}$), in the $MoSi_2$ coated Mo sample is about $4.0\times10^{-4}$ (cm/$\sqrt{sec}$) at 1200° C. which is significantly larger than the estimated k value of about $9\times10^{-6}$ (cm/$\sqrt{sec}$) in the current work at 1200° C. In fact, the growth kinetics of the $Mo_5Si_3$ phase is closely related to the Si transport towards substrate, instead of towards the free surface. It is considered that the slow kinetics in the current work is related to the layer developed between $T_1$ and substrate with the associated boron content.

It is also worth noticing that the thickness of the $Mo_5Si_3$ phase for these experiments does not show a considerable thickness change even after a complete elimination of the $MoSi_2$ phase. This suggests that while the rapid growth of the $T_1$ phase in replacing the $MoSi_2$ phase is similar to the case of binary Mo—Si system, the change in the $T_1$ phase layer thickness is essentially stalled afterwards. This implies that there must be an effective diffusion barrier formed underneath the $T_1$ phase coating inhibiting Si diffusion inward into the substrate and hence consuming the $T_1$ phase coating.

Figure 5:
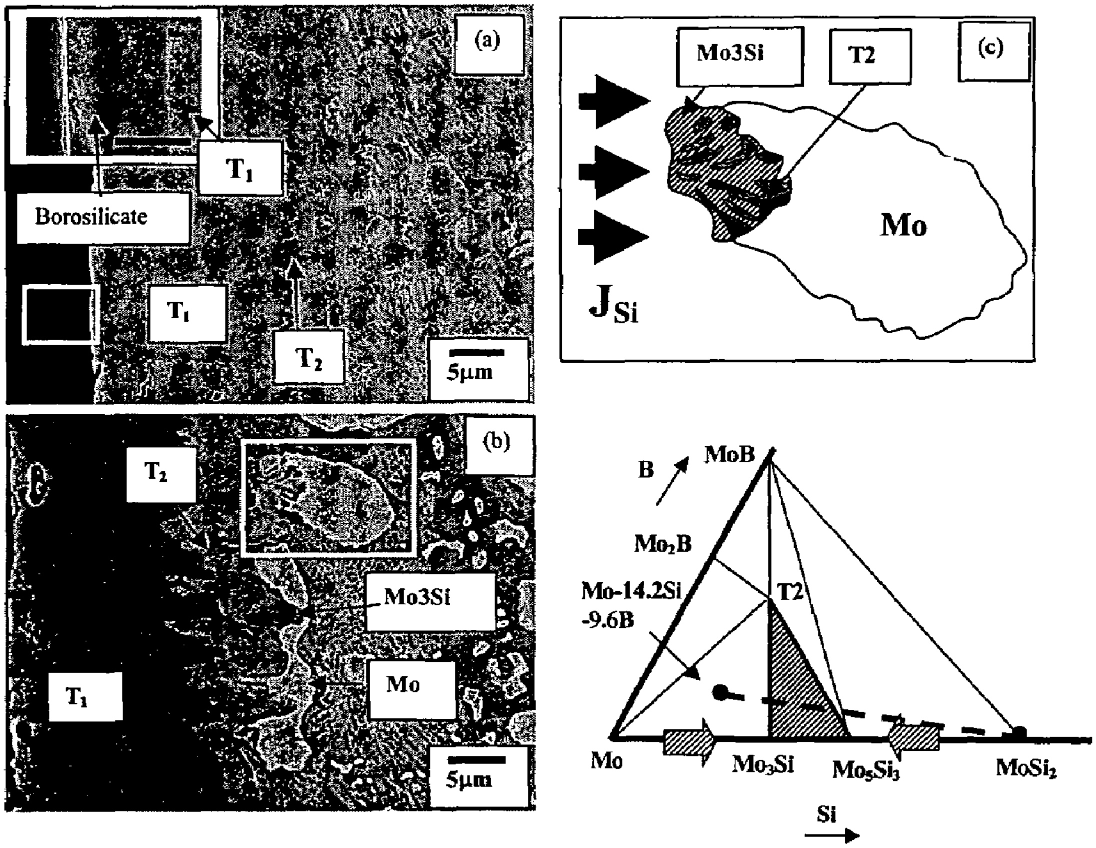
FIG. 5 shows a BSE image of a silicide coated Mo—Si—B alloy exposed at 1300° C. for 25 hr in air (a) shows the developed borosilicate outer layer (Bar in the inlet marks 3 μm), (b) shows the phase transformation of Mo, (c) shows a schematic figure of the marked area in (b), and (d) shows a schematic Mo—Si—B phase diagram (Mo rich corner) indicating the development of phase evolution upon oxidation testing.

The synthesized $MoSi_2$ phase is not in equilibrium with the three-phase Mo (ss)+$T_2$+$Mo_3Si$ mixture in the substrate and therefore upon exposure to high temperature or oxidation, other silicide phase and borosilicide phases are expected to form. After oxidation in air at 1300° C. for 25 hr, the $T_1$ phase was synthesized from the $MoSi_2$ outer layer with a thin outer layer of borosilicate as shown in FIG. 5(*a*). This attributed to the excellent oxidation resistance of the $T_1$ phase coating even at 1300° C.

Since the outer borosilicate layer growth upon high temperature exposure for the coated sample is not significant, the main reservoir for the Si content in the shrinking $MoSi_2$ layer should be the substrate. The $T_2$ layer (beneath $T_1$ layer) together with $Mo_3Si$ exists and both phases protrude into the substrate (FIG. 5(*b*)). As expected, upon Si inward diffusion mainly the Mo phase is transformed into the $Mo_3Si$ and the $T_2$ phases (FIG. 5(*c*)). In fact, as mentioned previously, the synthesized $MoSi_2$ layer contains MoB dispersoids and there is a $Mo_5Si_3$ (+MoB) mixture at the interface between $MoSi_2$ layer and the substrate. However, upon oxidation annealing, the $MoSi_2$ layer becomes a $T_1$ layer as shown in FIG. 5(*a*). From the observations of the oxidized pack cementation sample and recalling that the substrate is composed of two eutectics (Mo+$T_2$ and $Mo_3Si$+$T_2$), the resultant reaction for the formation of $T_1$ and $T_2$ may be written:

$$Mo(s.s.)+T_2(Mo_5SiB_2)\rightarrow Mo_3Si+T_2(Mo_5SiB_2)\rightarrow T_1(Mo_5Si_3)+T_2(Mo_5SiB_2)$$

$$Mo_3Si+T_2\rightarrow T_1(Mo_5Si_3)+T_2(Mo_5SiB_2)$$

Also, it is useful to consider the diffusion pathway to understand the phase evolution upon oxidation processing (FIG. 5(*d*)). Initially, after coating, the $MoSi_2$ layer with MoB dispersoids is synthesized, and the $T_1$ and MoB eutectoid is produced between outer $MoSi_2$(+MoB) layer and substrate. It is clear that $Mo_5Si_3$ phase should exist in order to meet the local equilibrium and it should also be noted that $Mo_5Si_3$ phase is not in equilibrium with pure Mo. While the exact kinetics of the phase formation next to the $Mo_5Si_3$ phase needs further refinement, $T_2$ and/or $Mo_3Si$ should exist next to $Mo_5Si_3$ phase. In this perspective, while the diffusion pathway proceeds towards the original substrate composition, the Mo near the reaction interface disappears and transforms into $Mo_3Si$ and $T_2$, to maintain equilibrium in the $Mo_3Si$-$T_2$-$T_1$ three-phase area. It is also important to point out that the $T_1$ layer is in contact with the $T_2$ layer which may explain the origin of the B content in the $T_1$ phase coating layer.

Figure 6:
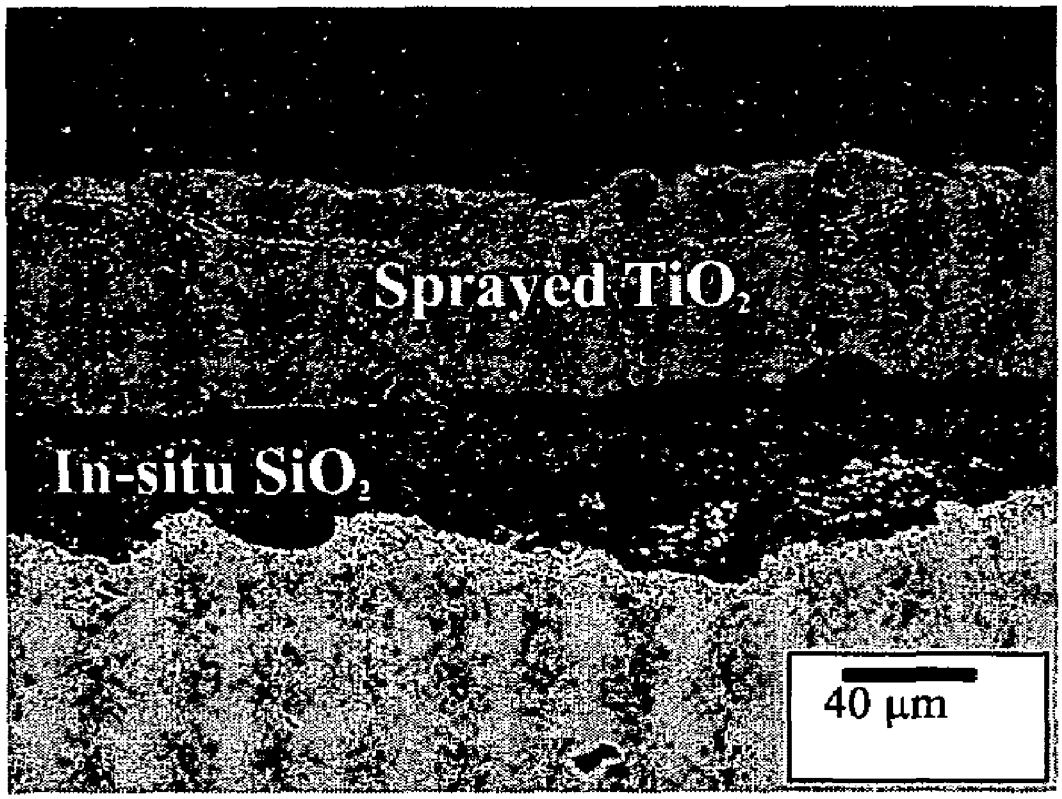
FIG. 6 shows a cross section of titania-coated Mo—Si—B substrate subjected to oxidation at 1200° C. for 100 hours. The titania was deposited using thermal spray processing.

The design strategy underlying both silica as well as in-situ silicide coatings as high temperature oxidation resistant can also be employed as the basis for the thermal barrier coating such as titania ($TiO_2$). FIG. 6 shows the cross section of the titania-coated Mo—Si—B substrate that been subjected to oxidation at 1200° C. for 100 hours. The titania was deposited using thermal spray processing. The natural borosilicate develops underneath the titania coating and there is no interphase reaction that can be discerned between the titania and the borosilicate. This confirms the high temperature compatibility of (boro)silica with a potential thermal barrier oxide such as titania. The coating system can be further modified for example with pack cementation treatment which produces silicide phases that naturally form silica when exposed to high temperatures.

Example 2

Preparation of an Oxidation Resistant Gradient Coating on a Mo—Si—B Alloy

Figure 7:
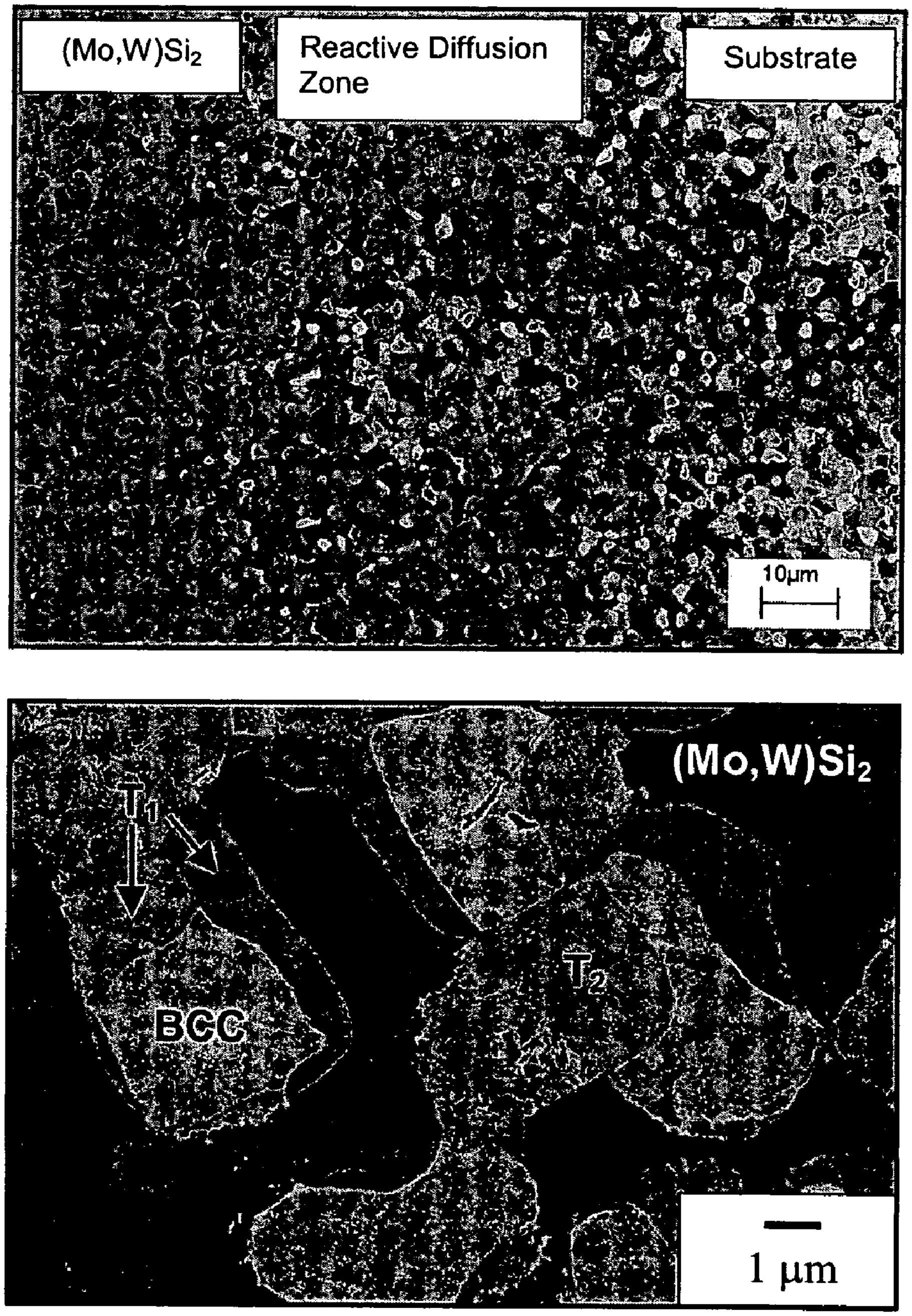
FIG. 7(*a*) shows a back-scattered image of Si-pack cementation coating in the three-phase substrate of $BCC+T_2+T_1$ phases in Mo—W—Si—B alloys. The transformation of the three phases into $(Mo,W)Si_2$ also allows for the formation of a reactive diffusion zone as depicted in with the main feature of not-completely transformed BCC (bright phase) and $T_2$ phases dispersed in the phase mixture with a $(Mo,W)Si_2$ as the matrix.

It has been shown recently that a small amount of a transition metal phase modifier, such as tungsten, alloyed with the coatings made from molybdenum, silicon, and boron, can alter the phase equilibrium of a Mo—Si—B system so that a three-phase field of BCC+$T_2$+$T_1$ can be stabilized (see R. Sakidja, S. Kim, J. S. Park and J. H. Perepezko, in *Defect Properties and Related Phenomena in Intermetallic Alloys,* E. P. George, H. Inui, M. J. Mills and G. Eggeler, Editors, p. BB2.3.1, MRS, Warrendale, Pa. (2003)). By coupling the alloying addition with the Si-pack cementation, a new coating structure has been synthesized as exemplified in FIG. 7. The coating consists of the (Mo, W)$Si_2$ phase as the outermost layer with a multiple phase reaction composed of mostly of the (Mo,W)$Si_2$ phase (dark phase). The capability of W substitution to accentuate the different mobility of silicon in the three phases is clearly demonstrated in this case. Unlike the $T_1$ phase which has transformed into the disilicide phase, the $T_2$ and BCC phases have not fully transformed. In this case, the diffusion front is described by the different reaction paths that are followed by each phase:

$$\text{W-alloyed } T_1+Si\rightarrow(Mo,W)Si_2 \quad (1)$$

W-alloyed BCC+Si→$T_1$(+Si)=>$(Mo,W)Si_2$ (2)

W-alloyed-$T_2$+Si→(Mo,W)+Boride Phase(s) (3)

The W-alloyed $T_1$ phase from the substrate appears to have the easiest or most direct path, enabling a complete transformation into the disilicide $(Mo,W)Si_2$ phase. On the other hand, the multiple phase reaction path and the slower Si mobility (apparently due to W substitution for Mo) result in a coating structure with the BCC phase dispersed within the disilicide matrix. Similarly, there is a relatively slow decomposition of the $T_2$ phase into the disilicide and boride phase (s). The resulting coating structure design offers the excellent oxidation resistance of the disilicide phase with enhanced structural integrity due to the dispersed BCC phase and kinetic resistance to modification due to sluggish diffusion rates.

Example 3

Borosilicate Coatings Having a Reduced Boron Concentrations on Mo—Si—B Alloys The following example presents a comparison of the oxidation resistance of a borosilicate coating having a reduced boron concentration in accordance with the present invention and a naturally occurring borosilicate coating.

Preparation of Samples

Ternary alloy ingots with a composition of Mo-14.2Si-9.6B (atomic %) were prepared by arc-melting in a Ti-gettered Ar atmosphere and sliced to 3 mm thick discs. Each sliced piece was polished with SiC paper and ultrasonically cleaned. For the coating studies, a $SiO_2$ powder layer of about 100 μm thickness was deposited at room temperature as a $SiO_2$/ethanol slurry by an air spray gun on the polished sample discs.

For oxidation testing, an alumina boat containing the sample discs was inserted into a furnace initially set at 1000 or 1200° C. in air. After the samples reached the designated exposure time, they were pulled out of the furnace promptly (air-cooling). Following the oxidation testing, the samples were cut perpendicular to the interface with a diamond saw. Finally, the cross sections were examined by SEM (Scanning Electron Microscopy (JEOL6100)) with BSE (Back Scattered Electron) imaging. An HR-TEM (High Resolution Transmission Electron Microscope (Phillips CM-200)) and XRD (X-ray Diffraction (STOE X-ray Diffraction System)) were used for crystal structure and phase identifications. The phase compositions were determined by EPMA (Electron Probe Micro Analysis (CAMECA SX51)).

Oxidation of an Uncoated Mo—Si—B Substrate

Figure 8:
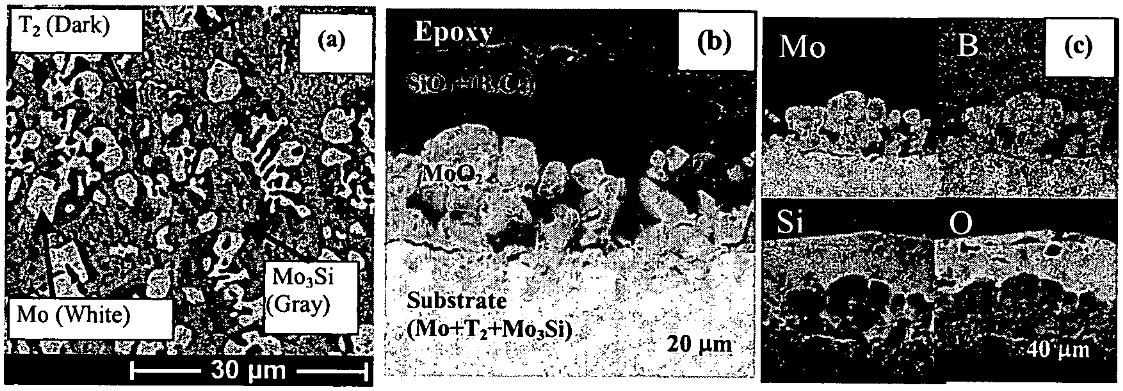
FIG. 8 shows a SEM back scattered image of (a) as-cast Mo-14.2Si-9.6B (at %) alloy, (b) cross section of Mo-14.2Si-9.6B (at %) alloy oxidized at 1000° C. for 100 hr in air, and (c) component X-ray maps of (b).
Figure 9:
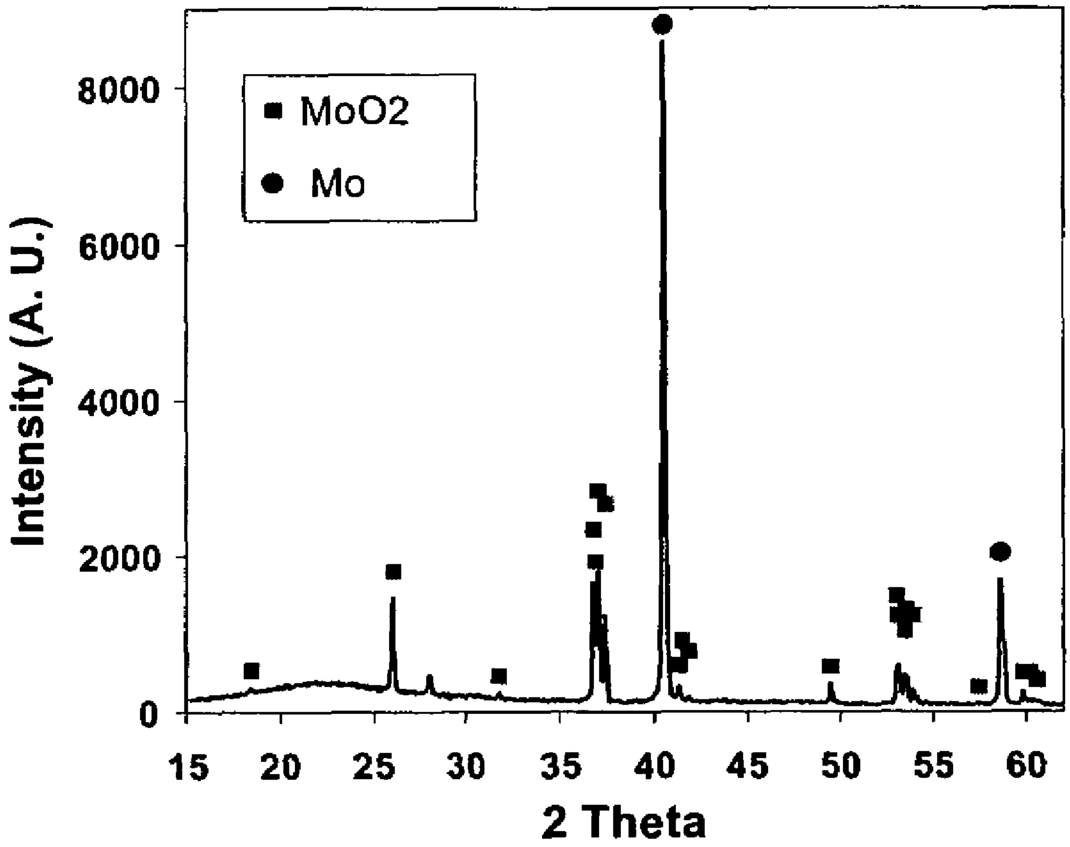
FIG. 9 shows XRD results showing the presence of mostly amorphous borosilicate, $MoO_2$ and Mo.

As shown in FIG. 8*a*, the alloy substrate had a three-phase microstructure based upon Mo (solid solution), $T_2$ and $Mo_3Si$ phases. The main constituents of the alloy microstructure are retained in the long-term annealed alloy. An SEM-BSE image together with x-ray maps of the alloy annealed at 1000° C. for 100 hr in air is shown in FIG. 8*b* and FIG. 8*c*. From the x-ray maps, the existence of Mo, Si and O is clearly indicated (due to X-ray interference between Mo Mz and B Kα line, additional contrast can be seen on the boron x-ray map). Three separate layer structures can be discerned in the cross section images: (1) the exterior borosilicate layer, (2) the $MoO_2$ phase and (3) Mo (solid solution) phase with oxide precipitates adjacent to the substrate. The exterior borosilicate layer surface was smooth and continuous. The three layers are reflected in the X-ray scan (FIG. 9) which indicates the presence of an amorphous phase (broad peak in the 2θ range of 15-30°), a predominant $MoO_2$ phase and the Mo(ss) phase. Further HR-TEM examination on the amorphous phase reveals that $MoO_2$ precipitates are also present within the borosilicate layer (FIGS. 10*a* and 10*b*). In addition, Si-rich oxide precipitates were also found in the substrate primary Mo(ss) phase adjacent to the $MoO_2$ layer. After oxidation at 800° C., the outermost scale is composed mainly of amorphous borosilicate, with a $MoO_2$ layer forming beneath it.

The composition of the oxide phases was quantified by EPMA. The amorphous $SiO_2$ layer was determined to contain about 10 atomic % B (or 17 mole % of $B_2O_3$) which is close to the liquidus at 1000° C. and that in the $MoO_2$ layer the solubility of boron and silicon is negligible.

From the layered product structure the kinetic sequence involved in oxidation can be depicted in terms of the diffusion pathway in FIG. 11*b*. The phase sequence illustrated in FIG. 11 indicates that the identified composition of the borosilicate layer is connected to $MoO_2$ behind the initial pole between oxygen and the substrate composition.

Oxidation of a Coated Mo—Si—B Substrate

In order to minimize the alloy recession, a spray deposition coating was applied to modify the borosilicate scale to enrich the $SiO_2$ content in order to reduce oxygen transport. The microstructure cross sections for the $SiO_2$ powder spray coated samples after oxidation at 1200° C. for 100 hr are shown in FIG. 12*a* and FIG. 12*b*. Following the oxidation exposure, this treatment reduced the underlying in-situ borosilicate and $MoO_2$ layer thickness by about 50% compared to the uncoated samples (FIG. 11*a*). Moreover, with an amorphous $SiO_2$ powder coating the $MoO_2$ layer did not form and the applied coating has combined with the in-situ borosilicate layer during oxidation annealing (FIG. 12*b*).

What is claimed is:

1. A method for producing an oxidation resistant multi-layered structure, the method comprising:

(a) exposing a Mo—Si—B alloy substrate or a substrate having a Mo—Si—B alloy surface character to a vapor comprising silicon and annealing the substrate to form a layer of $MoSi_2$ on the substrate; and (b) annealing the $MoSi_2$ layer to produce an outer borosilicate layer, an intermediate layer comprising molybdenum disilicides, molybdenum silicides, or combinations thereof, and an inner borosilicide layer, wherein the inner borosilicide layer is integrated with the substrate.

2. The method of claim 1 wherein the substrate comprises a transition metal, a metalloid, a simple metal, or alloys or combinations thereof.

3. The method of claim 1 wherein the transition metal is selected from the group consisting of titanium, zirconium, hafnium, vanadium, niobium, tantalum, chromium, tungsten, iron, manganese, and cobalt.

4. The method of claim 2 wherein the metalloid or simple metal is selected from the group consisting of aluminum, carbon, boron, phosphorus, germanium, gallium, tin, and indium.

5. The method of claim 1, further comprising applying a thermal barrier layer above the outer borosilicate layer.

6. A method for producing an oxidation resistant structure, the method comprising:

(a) exposing a Mo—Si—B alloy substrate that has been alloyed with a phase modifier element, or a substrate having a Mo—Si—B alloy surface character that has been alloyed with a phase modifier element, to a vapor comprising silicon;

(b) annealing the substrate to form a coating having an outermost region comprising $MoSi_2$ alloyed with the phase modifier element; and (c) annealing the coating in the presence of oxygen to produce a multiphase oxidation resistant coating having a compositional gradient with a higher concentration of oxidation resistant phases in the outer region than in the inner region and a higher concentration of silicon diffusion resistant phases in the inner region than in the outer region;

wherein the multiphase oxidation resistant coating is integrated with the substrate.

7. The method of claim 6, wherein the phase modifier element is tungsten.

8. The method of claim 6, wherein the phase modifier element is selected from the group consisting of hafnium, niobium and titanium.

9. The method of claim 6, wherein the substrate comprises a transition metal, a metalloid, a simple metal, or alloys or combinations thereof.

10. The method of claim 9, wherein the substrate comprises a transition metal selected from the group consisting of titanium, zirconium, hafnium, vanadium, niobium, tantalum, chromium, tungsten, iron, manganese, and cobalt.

11. The method of claim 9, wherein the substrate comprises a metalloid or simple metal selected from the group consisting of aluminum, carbon, boron phosphorus, germanium, gallium, tin, and indium.

12. The method of claim 6, further comprising applying a thermal barrier layer above the borosilicate layer.

13. The method of claim 1 wherein the concentration of boron in the outer borosilicate layer is no more than about 10 atomic percent.

14. A method for producing an oxidation resistant multilayered structure, the method comprising:

(a) exposing a substrate comprising molybdenum to boron;

(b) exposing the substrate to a vapor comprising silicon and annealing the substrate to form a layer of $MoSi_2$ on the substrate; and (c) annealing the $MoSi_2$ layer to produce an outer borosilicate layer and an inner borosilicide layer.

15. The method of claim 14 further comprising alloying the substrate with a transition metal, metalloid or simple metal other than molybdenum, boron and silicon.

16. The method of claim 14 further comprising alloying the substrate with aluminum.

17. The method of claim 14 wherein the substrate is exposed to boron via pack cementation.

18. The method of claim 14 wherein the substrate is exposed to boron via chemical vapor deposition.

19. A method for producing an oxidation resistant structure, the method comprising:

(a) alloying a substrate comprising molybdenum with a phase-modifier element;

(b) exposing the substrate to boron;

(c) exposing the substrate to a vapor comprising silicon; and (d) annealing the substrate to form a coating having an outermost region comprising $MoSi_2$ alloyed with the phase modifier element; and (e) annealing the coating in the presence of oxygen to produce a multiphase oxidation resistant coating having a compositional gradient with a higher concentration of oxidation resistant phases in the outer region than in the inner region and a higher concentration of silicon diffusion resistant phases in the inner region than in the outer region;

wherein the multiphase oxidation resistant coating is integrated with the substrate.

20. The method of claim 19 wherein the phase-modifier element is tungsten.

* * * * *